(12) United States Patent
Ho et al.

(10) Patent No.: US 7,683,369 B2
(45) Date of Patent: Mar. 23, 2010

(54) STRUCTURE FOR MEASURING BODY PINCH RESISTANCE OF HIGH DENSITY TRENCH MOSFET ARRAY

(75) Inventors: Moses Ho, Campbell, CA (US); Tiesheng Li, San Jose, CA (US); Il Kwan Lee, San Jose, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 188 days.

(21) Appl. No.: 12/100,554

(22) Filed: Apr. 10, 2008

(65) Prior Publication Data
US 2009/0256149 A1 Oct. 15, 2009

(51) Int. Cl.
*H01L 21/66* (2006.01)
(52) U.S. Cl. .................... 257/48; 257/E21.521; 438/18
(58) Field of Classification Search ............... 257/48, 257/E21.521; 438/18
See application file for complete search history.

(56) References Cited

U.S. PATENT DOCUMENTS

| | | | |
|---|---|---|---|
| 6,172,398 B1 * | 1/2001 | Hshieh | 257/330 |
| 6,750,507 B2 * | 6/2004 | Williams et al. | 257/328 |
| 6,861,716 B1 * | 3/2005 | Hyde | 257/401 |
| 2004/0021173 A1 * | 2/2004 | Sapp | 257/330 |

* cited by examiner

Primary Examiner—Victor A Mandala
(74) Attorney, Agent, or Firm—Chein-Hwa Tsao; CH Emily LLC

(57) ABSTRACT

A structure is disclosed for measuring body pinch resistance Rp of trench MOSFET arrays on a wafer. The trench MOSFET array has a common drain layer of first conductivity type and a 2D-trench MOSFET array atop the common drain layer. The 2D-trench MOSFET array has an interdigitated array of source-body columns and gate trench columns. Each source-body column has a bottom body region of second conductivity type with up-extending finger structures. Each source-body column has top source regions of first conductivity type bridging the finger structures. The structure includes:

a) A source-body column wherein each finger structure of the bottom body region has a formed top contact electrode.

b) Two gate trench columns flank the source-body column and both have a formed top common gate contact electrode.

Upon connection of the structure to external voltage/current measurement devices, Rp can be measured while mimicking the parasitic effect of neighboring trench MOSFETs.

13 Claims, 7 Drawing Sheets

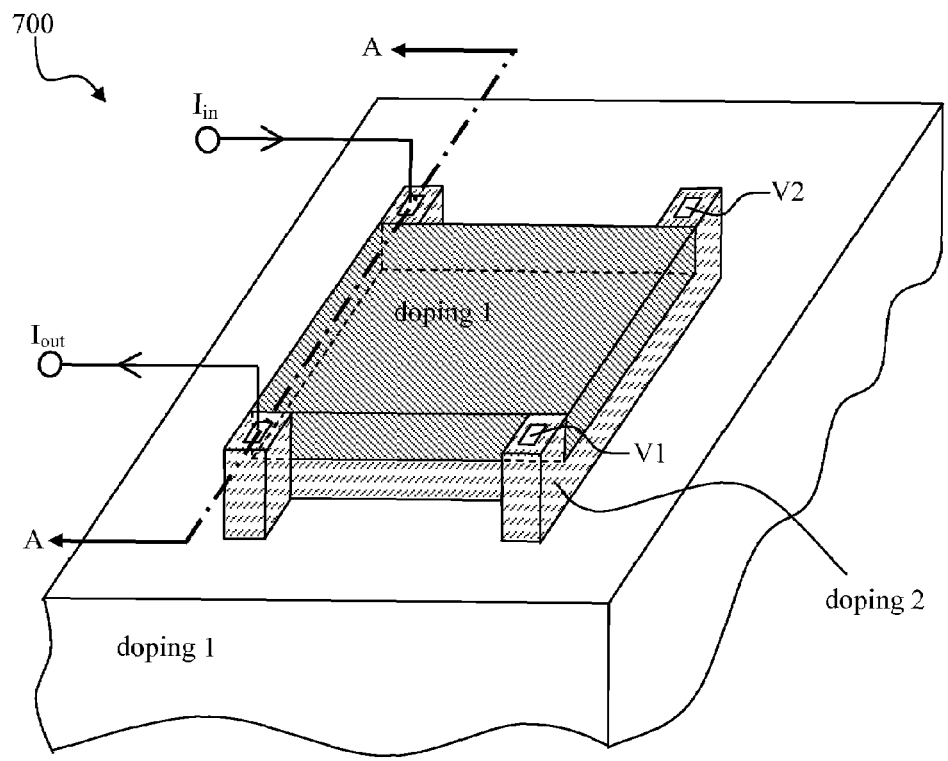
Fig. 2A PRIOR ART
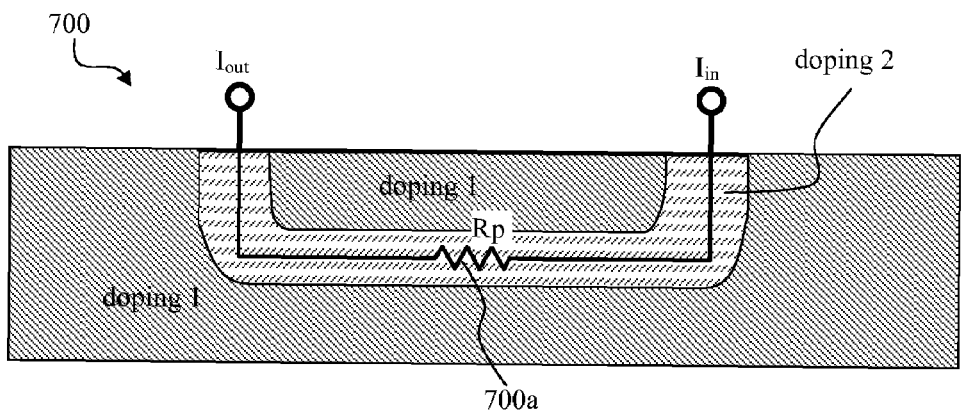
Fig. 2B PRIOR ART Section A-A

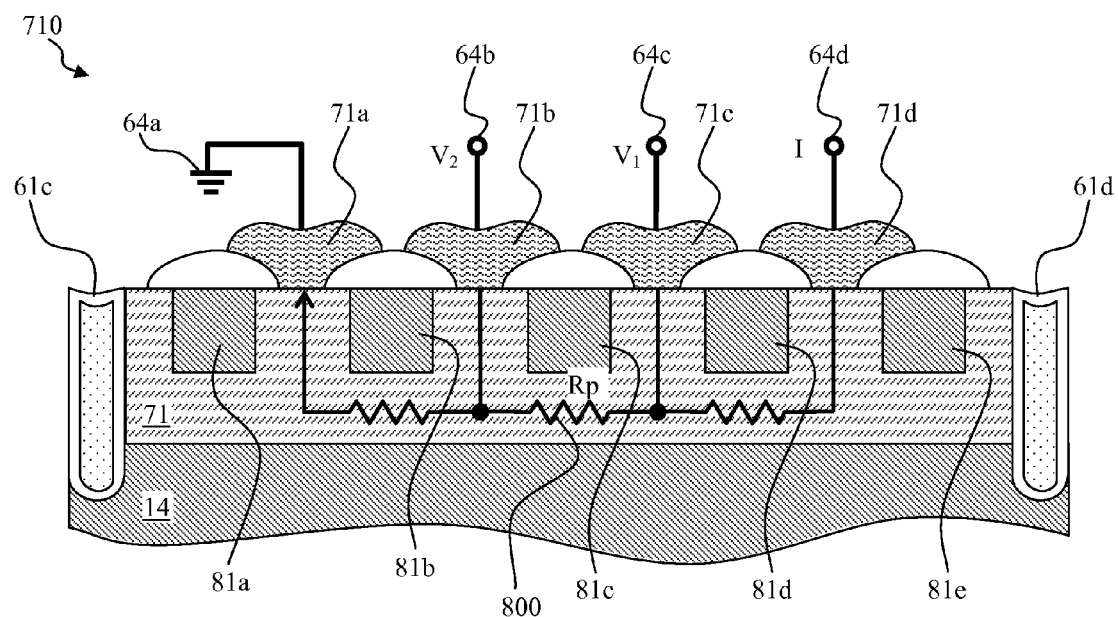
Fig. 4B Section B-B
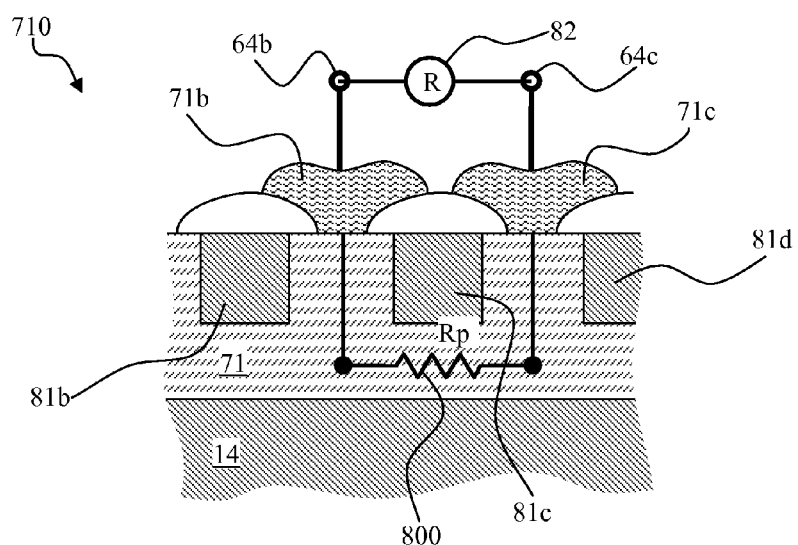
Fig. 4C Section B-B

STRUCTURE FOR MEASURING BODY PINCH RESISTANCE OF HIGH DENSITY TRENCH MOSFET ARRAY

CROSS REFERENCE TO RELATED APPLICATIONS

1. Field of Invention

This invention relates generally to the field of semiconductor device fabrication. More specifically, the present invention is directed to a device structure and associated technique to measure thus monitor manufacturing quality of semiconductor device wafers.

2. Background of the Invention

MOSFET (metal-oxide-semiconductor field effect transistor) devices have many industrial applications, such as power amplifiers, power switches and low noise amplifiers to name a few. Regardless of the variety of applications, one of the fundamental device performance parameters of key importance is its body pinch resistance, abbreviated $R_p$, as it distills numerous wafer processing quality parameters, such as starting wafer quality, dopant concentration, doping profile and device geometry to name a few, affecting final MOSFET device performance into a single measurable number that needs to be controlled within a pre-determined tolerance range for a processed wafer to be acceptable. Thus, as illustrated in FIG. 1, typically a semiconductor wafer 10 is mapped to include a large number of device product sites 13a and a few $R_p$-measurement sites 13b co-located on the same semiconductor wafer 10. While the numerous MOSFET devices from the device product sites 13a are intended to be separated then further packaged into products, the body pinch resistance of the $R_p$-measurement sites 13b are monitored for quality control of the processed semiconductor wafer 10.

FIG. 2A illustrates a prior art $R_p$-measurement structure 700 in perspective and FIG. 2B shows its cross sectional view along a section A-A. For N-channel MOSFET devices, the various doped regions marked with "doping 1" are of a first conductivity type that is N-type while the doped region marked with "doping 2" are of a second conductivity type that is P-type, and vice versa for P-channel MOSFET devices. Thus, the body channel of doping 2 and marked with an equivalent $R_p$ is only pinched from top and bottom with regions of doping 1. To those skilled in the art, the terminals marked with "$I_{in}$" and "$I_{out}$" are for current flow through the body channel of doping 2 while the terminals marked with "$V_1$" and "$V_2$" are for voltage measurement of the electric field across the body channel of doping 2, taken together to arrive at the desired body pinch resistance 700a of $R_p$.

As the spatial density of MOSFET device integration gets sufficiently high, to be presently described, parasitic effects from neighboring device structure become significant thus affect the ability of the prior art $R_p$-measurement structure 700 to represent the real device behavior. Hence there exists a need to modify the above prior art $R_p$-measurement structure 700 for high density MOSFET devices.

SUMMARY OF THE INVENTION

A structure for measurement of body pinch resistance $R_p$ of high density trench MOSFET array co-located on a semiconductor wafer is disclosed. The wafer substrate is of first conductivity type. The high density trench MOSFET array has a common drain foundation layer of first conductivity type atop the wafer substrate and a two-dimensional (2D) trench MOSFET array atop the common drain foundation layer. The 2D-trench MOSFET array has an interdigitated column array of source-body columns and insulated gate trench columns. Each source-body column has a bottom body region of second conductivity type with a first plurality of finger structures extending upwards and, correspondingly, each source-body column also has a second plurality of top source regions of first conductivity type bridging the finger structures. The structure for measurement includes:

a) A source-body column, atop the common drain foundation layer, wherein each top surface of a selected number of finger structures of the bottom body region further includes a formed contact electrode resulting in a corresponding number of contact electrodes.

b) Two insulated gate trench columns each atop the common drain foundation layer. The insulated gate trench columns flank the source-body column and both further include a formed common gate contact electrode.

Upon an electrical connection of the contact electrodes and the common gate contact electrode with a corresponding number of external biasing power supplies and voltage/current measurement devices, $R_p$ can then be measured as the body pinch resistance through the bottom body region while mimicking the parasitic effect of neighboring trench MOSFET devices of the high density trench MOSFET array.

The two insulated gate trench columns further include a conductive gate material filling the trenches and a surrounding insulating gate dielectric layer separating the gate material from the source-body column and the common drain foundation layer. In one embodiment, the gate material is made of polysilicon and the gate dielectric layer is made of silicon dioxide.

In a more specific embodiment, the bottom body region includes two selected finger structures and, correspondingly:

1) The common gate contact electrode is connected to an external biasing voltage supply.
2) The corresponding two contact electrodes are connected to an external 2-terminal resistance measurement device for measuring the body pinch resistance through the bottom body region.

In another more specific embodiment, the bottom body region includes four selected finger structures and, correspondingly:

1) The common gate contact electrode is connected to an external biasing voltage supply.
2) The corresponding four contact electrodes are connected to an external 4-terminal resistance measurement device for measuring the body pinch resistance through the bottom body region.

In another embodiment, the common drain foundation layer is an epitaxial layer.

In a more specific embodiment, the first conductivity type is P-type and the second conductivity type is N-type. Alternatively, the first conductivity type can be N-type and the second conductivity type is P-type.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative:

FIG. 2A illustrates a prior art $R_p$-measurement structure in perspective and FIG. 2B shows its cross sectional view along a section;

FIG. 4A-1 illustrates the present invention structure for $R_p$-measurement that is co-located with high density trench MOSFET arrays on a semiconductor wafer;

FIG. 4A-2 illustrates the same present invention structure for $R_p$-measurement with portions of the front and back removed to show its source-body column more clearly;

FIG. 4B illustrates a cross section of the present invention structure for $R_p$-measurement along its source-body column together with four contact electrodes for $R_p$-measurement; and FIG. 4C illustrates a cross section of the present invention structure for $R_p$-measurement along its source-body column together with two contact electrodes for $R_p$-measurement.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 3A:
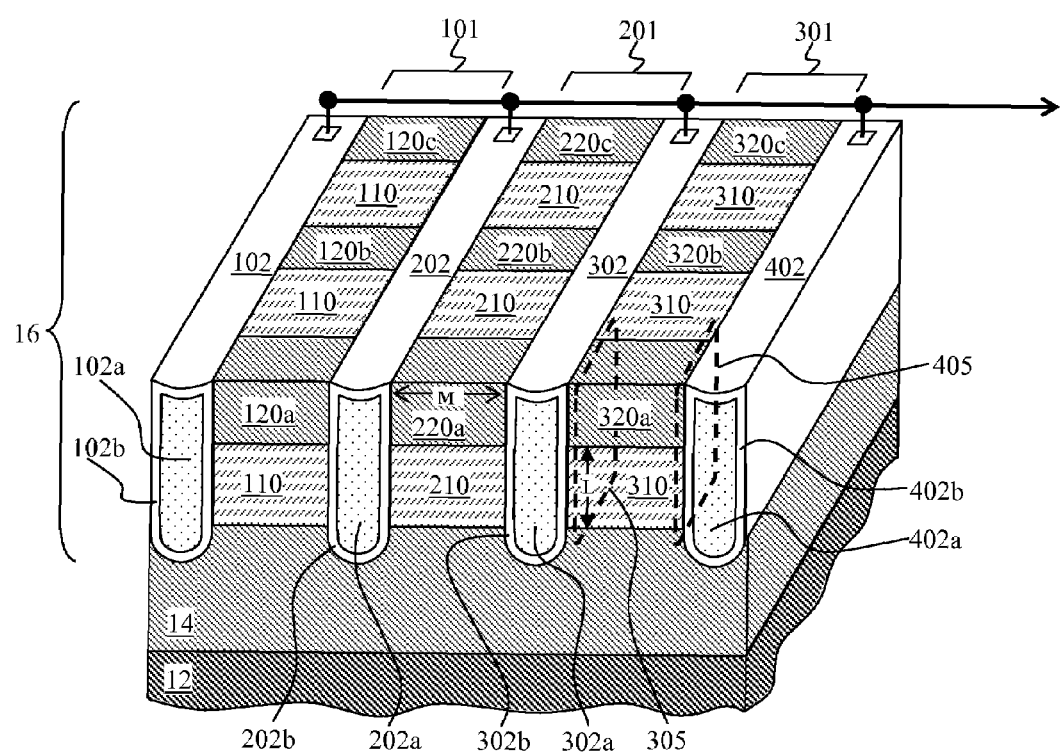
FIG. 3A illustrates in perspective a high density trench MOSFET array atop a semiconductor wafer.
Figure 3B:
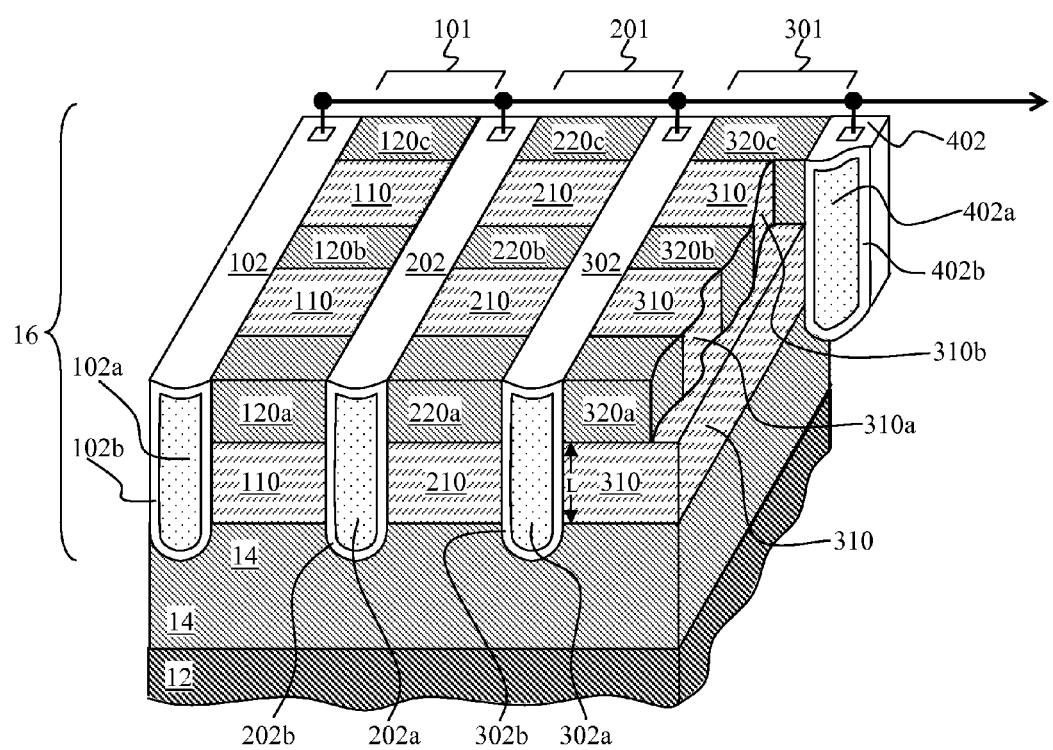
FIG. 3B illustrates the same high density trench MOSFET array with a partially cut away corner to show one of its source-body columns more clearly.

FIG. 3A illustrates in perspective a high density 2D-trench MOSFET array 16 atop a semiconductor wafer substrate 12 of first conductivity type. FIG. 3B illustrates the same 2D-trench MOSFET array 16 with a partially cut away corner to show one source-body column-3 301 more clearly. The 2D-trench MOSFET array 16 has a bottom common drain foundation layer 14 of first conductivity type atop the wafer substrate 12. In one embodiment, the common drain foundation layer 14 is made of an epitaxial layer. The 2D-trench MOSFET array 16 also has an interdigitated column array of source-body columns (source-body column-1 101, source-body column-2 201, source-body column-3 301) and insulated gate trench columns (insulated gate trench column-1 102, insulated gate trench column-2 202, insulated gate trench column-3 302, insulated gate trench column-4 402). Each source-body column has a bottom body region of second conductivity type with a first plurality of finger structures extending upwards and, correspondingly, each source-body column also has a second plurality of top source regions of first conductivity type bridging the finger structures. For example, the source-body column-3 301 has a bottom body region 310 of second conductivity type with finger structures 310a and 310b extending upwards. Correspondingly, the source-body column-3 301 also has a second plurality of top source regions 320a, 320b and 320c of first conductivity type bridging the finger structures 310a and 310b. While the finger structures of the bottom body region 110 of the source-body column-1 101 are not visible in this view, these finger structures are bridged by the top source regions 120a, 120b and 120c of first conductivity type. Likewise, while the finger structures of the bottom body region 210 of the source-body column-2 201 are not visible in this view, these finger structures are bridged by the top source regions 220a, 220b and 220c of first conductivity type.

Each of the insulated gate trench columns has a conductive gate material and a surrounding insulating gate dielectric layer separating the gate material from the source-body column and the common drain foundation layer 14. For example, the insulated gate trench column-1 102 has a conductive gate material 102a and a surrounding insulating gate dielectric layer 102b separating the gate material 102a from the source-body column-1 101 and the common drain foundation layer 14. For another example, the insulated gate trench column-2 202 has a conductive gate material 202a and a surrounding insulating gate dielectric layer 202b separating the gate material 202a from the source-body column-1 101, the source-body column-2 201 and the common drain foundation layer 14. As a third example, the insulated gate trench column-4 402 has a conductive gate material 402a and a surrounding insulating gate dielectric layer 402b separating the gate material 402a from the source-body column-3 301 and the common drain foundation layer 14, etc. As a specific embodiment, the wafer substrate 12 can be made of silicon, the gate material is made of polysilicon and the gate dielectric layer is made of silicon dioxide. As with the others, the insulated gate trench column-3 302 has a conductive gate material 302a and a surrounding insulating gate dielectric layer 302b.

To those skilled in the art, the 2D-trench MOSFET array 16 has a 2D-array of trench MOSFETs with a common drain made of the common drain foundation layer 14. The numerous trench MOSFETs within a single source-body column further share a common body and two common control gates, one on each side of the source-body column. For example:

a trench MOSFET 305, of channel length L, is formed amongst the top source region 320a, the bottom body region 310, the common drain foundation layer 14 and the insulated gate trench column-3 302. Furthermore, through the top surfaces of the finger structures 310a and 310b, the bottom body region 310 can be electrically connected to the source and body contact metal layer (not shown) overlaying on the top surface which also connects to the top source regions 320a, 320b and 320c. To avoid obscuring details, the shorting contacts and metallization are not shown here.

a trench MOSFET 405, also of channel length L, is formed amongst the top source region 320a, the bottom body region 310, the common drain foundation layer 14 and the insulated gate trench column-4 402. Likewise, through the top surfaces of the finger structures 310a and 310b, the bottom body region 310 can be electrically connected to the source and body contact metal layer overlaying on the top surface which also connects to the top source regions 320a, 320b and 320c.

To avoid obscuring details, the shorting contacts and metallization are not shown here.

The trench MOSFET 305 and the trench MOSFET 405 are separated by a distance M, called mesa width.

A typical application of the 2D-trench MOSFET array 16 is that, when all the individual MOSFETs (305, 405, etc.) are connected in parallel, the 2D-trench MOSFET array 16 will achieve a correspondingly increased power handling capability.

Notice that, in parallel with the trench MOSFET 305 is a parasitic vertical bipolar transistor formed with regions 320*a*, 310 and 14. If falsely turned on, this parasitic bipolar transistor could damage the functionality of the trench MOSFET 305. Since both the bottom body region 310 and the finger structure 310*a* have significant body resistance, under a high current condition through the trench MOSFET 305 sufficient voltage drop can develop between bottom part of the bottom body region 310 and top part of the finger structure 310*a* hence falsely turning on the parasitic bipolar transistor. A parasitic bipolar transistor is inherent in all MOSFETs, which is why it is important to measure body resistance to ensure that it is not too high. As the body pinch-off effect works to raise the body resistance with a degree of raise that increases with a decreasing mesa width M, it becomes important to include the effect of neighboring MOSFETs in the measurement of $R_p$ for high density 2D-trench MOSFET arrays where the mesa width M is small. Empirically, the following has been determined:

When mesa width M is close to or smaller than 2×channel length L the effect of body pinch-off from neighboring gate trenches become significant.

Whereas in the prior art, on the body pinch resistance from above and below are taken into account, for high density MOSFET arrays with very small mesa width M, the effects from the neighboring MOSFETs must also be taken into account. In view of the above discussion, a representative structure for $R_p$-measurement of high density MOSFET arrays that includes the effect of neighboring gate trenches should be employed.

Figure 1:
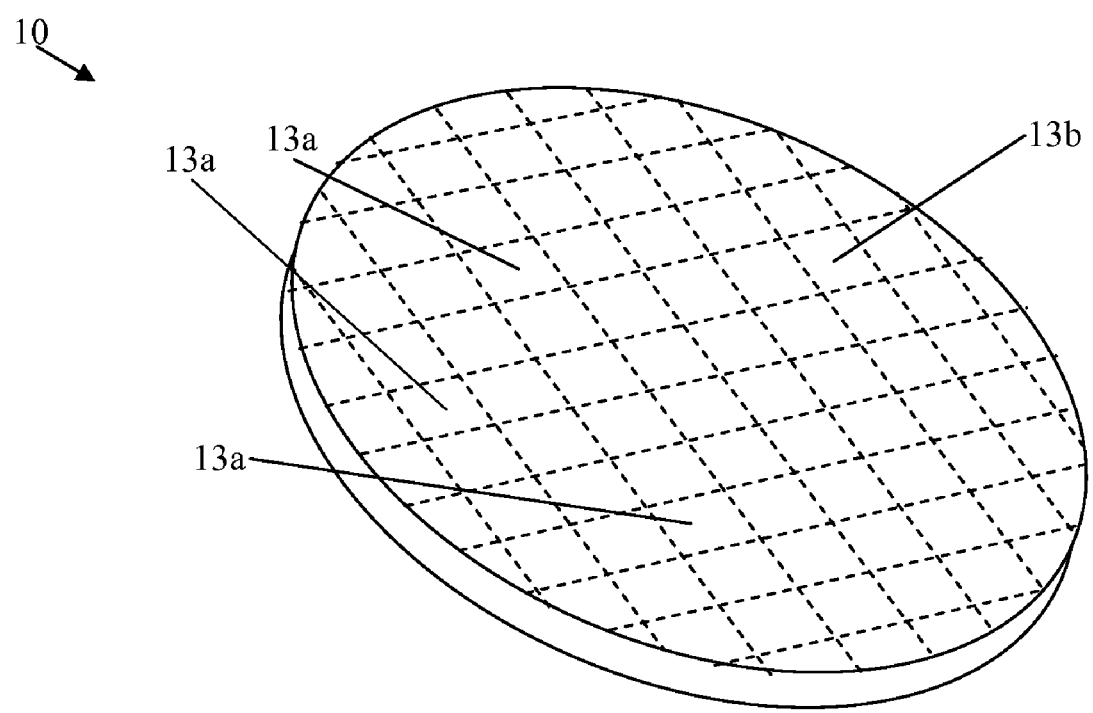
FIG. 1 illustrates a typical manning of a semiconductor wafer into a large number of device product sites and a few $R_p$-measurement sites co-located on the same semiconductor wafer.
Figures 1, 4A:
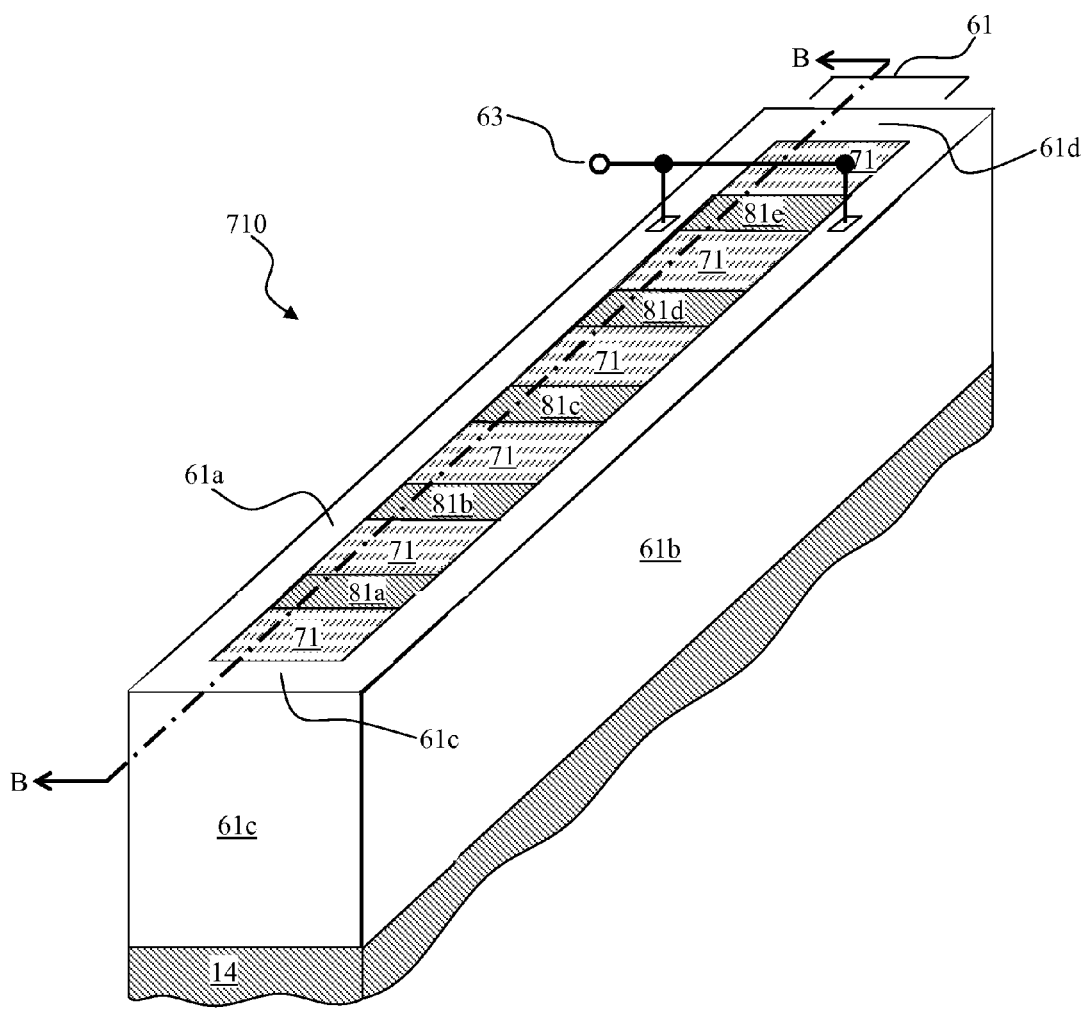
Figures 2, 4A:
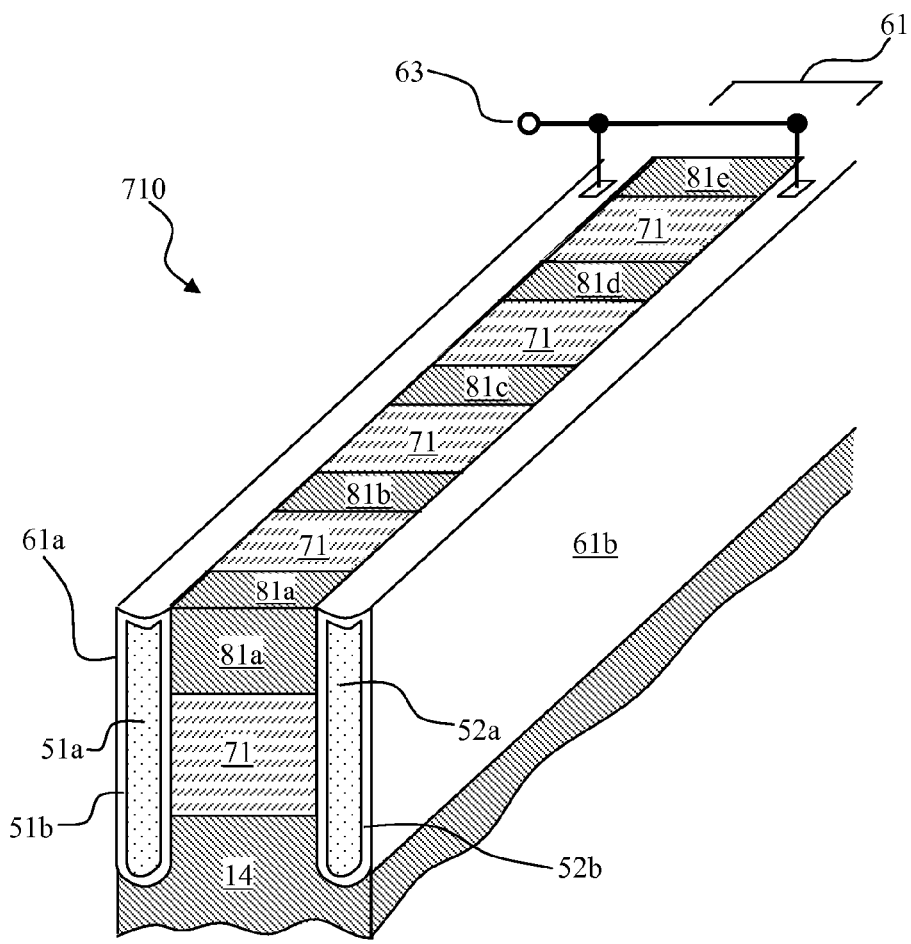

FIG. 4A-1 and FIG. 4A-2 illustrate the present invention $R_p$-measurement structure 710 that is co-located with high density trench MOSFET arrays (such as the 2D-trench MOSFET array 16) on a semiconductor wafer (such as the semiconductor wafer 10 of FIG. 1). In FIG. 4A-2, the front and back trenches, 61*c* and 61*d* respectively, as well as the front and back portions of the source-body column 61, are removed to better show the structures of the source-body column 61 and of the insulated gate trenches 61*a* and 61*b*. FIG. 4B illustrates a cross section B-B of the present invention $R_p$-measurement structure 710 along its source-body column 61 together with four contact electrodes for measuring a body pinch resistance 800. The present invention $R_p$-measurement structure 710 has a source-body column 61 atop a common drain foundation layer 14. Except for the labeling of bottom body region 71 and top source regions 81*a*, 81*b*, 81*c*, 81*d*, 81*e*, the internal structure of the source-body column 61 mimics a corresponding source-body column of the 2D-trench MOSFET array 16, such as the source-body column-3 301. While not shown in FIG. 4A to avoid obscuring details, contact electrodes 71*a*, 71*b*, 71*c* and 71*d* formed atop a selected number of finger structures of the bottom body region 71 are illustrated in FIG. 4B. In turn, the contact electrodes 71*a*, 71*b*, 71*c* and 71*d* are respectively connected to a ground terminal 64*a*, a voltage measurement terminal V2 64*b*, a voltage measurement terminal V1 64*c* and a current bias terminal I 64*d*. Importantly, insulated gate trench column-1 61*a* and insulated gate trench column-2 61*b*, each atop the common drain foundation layer 14, flanking the source-body column 61 are included as an integral part of the present invention $R_p$-measurement structure 710. Except for the labeling of gate material 51*a* and gate dielectric layer 51*b*, the internal structure of the insulated gate trench column-1 61*a* mimics a corresponding insulated gate trench column of the 2D-trench MOSFET array 16 of FIGS. 3A-3B, such as the insulated gate trench column-1 102. The insulated gate trench column-1 61*a* and insulated gate trench column-2 61*b* are tied together into a gate voltage bias 63.

Thus, as illustrated in FIG. 4B, upon further electrical connection of the following:

The current bias terminal I 64*d* and the ground terminal 64*a* to an external current supply I.

The voltage measurement terminal V2 64*b* and the voltage measurement terminal V1 64*c* to an external differential voltage measurement device.

The body pinch resistance 800 can be measured as the pinch resistance through the bottom body region 71 while mimicking the parasitic effect of neighboring trench MOSFET devices of a high density trench MOSFET array. For those skilled in the art, numerous other schemes are available for measuring the body pinch resistance 800 using the four terminals 64*a*, 64*b*, 64*c* and 64*d*. For one example, terminals 64*a* and 64*d* can be hooked up to an external voltage supply then terminals 64*b* an 64*c* hooked up to external voltage measurement devices.

FIG. 4C illustrates an alternative embodiment of the present invention $R_p$-measurement structure 710 along its source-body column 61 together with two contact electrodes 71*b* and 71*c* for measuring the body pinch resistance 800. Here, the two contact electrodes 71*b* and 71*c* are formed atop two finger structures of the bottom body region 71. In turn, the contact electrodes 71*b* and 71*c* are connected to an Ohmmeter 82 to measure the body pinch resistance 800. Alternatively, the contact electrodes 71*b* and 71*c* can be hooked up to an external voltage supply with built-in current sensing to measure then calculate the body pinch resistance 800. In yet another alternative embodiment, the contact electrodes 71*b* and 71*c* can be hooked up to a Wheatstone bridge for $R_p$-measurement.

In summary, while the prior art $R_p$-measurement structure 700 models the body pinch resistance 700*a* pinched only from the top and bottom, the present invention $R_p$-measurement structure 710 models the body pinch resistance 800 pinched from the top, the bottom plus both side gate trenches hence more closely representing the device performance of the high density 2D-trench MOSFET array 16.

While the description above contains many specificities, these specificities should not be constructed as accordingly limiting the scope of the present invention but as merely providing illustrations of numerous presently preferred embodiments of this invention. To those skilled in the art, it should become clear that the invention expects to be applicable to other types of semiconductor wafer substrate as well, such as Germanium (Ge), Silicon-Germanium (SiGe), Gallium-Arsenide (GaAs), etc.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. For example, although the present invention describes application to a 2D-trench MOSFET array, the invention is equally applicable to a one dimensional-trench MOSFET array as well. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A structure for measurement of body pinch resistance of high density trench MOSFET array co-located on a semiconductor wafer with a wafer substrate of first conductivity type, the high density trench MOSFET array having a common drain foundation layer of first conductivity type atop the wafer substrate, a two-dimensional (2D) trench MOSFET array atop the common drain foundation layer, the 2D-trench MOSFET array having an interdigitated column array of source-body columns and insulated gate trench columns, each source-body column having a bottom body region of second conductivity type with a first plurality of finger structures extending upwards therefrom and, correspondingly, each source-body column also having a second plurality of top source regions of first conductivity type bridging the finger structures, the structure for measurement comprises:

a) a source-body column, atop the common drain foundation layer, wherein each top surface of a selected number of finger structures of the bottom body region further comprises a contact electrode formed thereon resulting in a corresponding number of contact electrodes; and b) two insulated gate trench columns, each atop the common drain foundation layer, flanking said source-body column and both further comprise a common gate contact electrode formed thereon whereby, upon electrical connection of the contact electrodes and the common gate contact electrode with a corresponding number of external biasing power supplies and voltage/current measurement devices, said body pinch resistance can be measured as the body pinch resistance through the bottom body region while mimicking the parasitic effect of neighboring trench MOSFET devices of the high density trench MOSFET array.

2. The structure for measurement of claim 1 wherein each of said two insulated gate trench columns further comprises a conductive gate material and a surrounding insulating gate dielectric layer separating the gate material from the source-body column and the common drain foundation layer.

3. The structure for measurement of claim 2 wherein said gate material is made of polysilicon.

4. The structure for measurement of claim 2 wherein said gate dielectric layer is made of silicon dioxide.

5. The structure for measurement of claim 1 wherein said bottom body region further comprises two selected finger structures and, correspondingly:

5a) the common gate contact electrode is connected to an external biasing voltage supply; and 5b) the corresponding two contact electrodes are connected to an external 2-terminal resistance measurement means for measuring the pinch resistance through the bottom body region.

6. The structure for measurement of claim 1 wherein said bottom body region further comprises four selected finger structures and, correspondingly:

6a) the common gate contact electrode is connected to an external biasing voltage supply; and 6b) the corresponding four contact electrodes are connected to an external 4-terminal resistance measurement means for measuring the pinch resistance through the bottom body region.

7. The structure for measurement of claim 1 wherein said common drain foundation layer is an epitaxial layer.

8. The structure for measurement of claim 1 wherein said first conductivity type is P-type and said second conductivity type is N-type.

9. The structure for measurement of claim 1 wherein said first conductivity type is N-type and said second conductivity type is P-type.

10. A semiconductor wafer comprises a wafer substrate of first conductivity type, a plurality of high density trench MOSFET arrays and at least one co-located structure for measurement thus monitoring body pinch resistance of the high density trench MOSFET arrays, wherein:

1. each high density trench MOSFET array further comprises a common drain foundation layer of first conductivity type atop the wafer substrate, a two-dimensional (2D) trench MOSFET array atop the common drain foundation layer, the 2D-trench MOSFET array further comprises an interdigitated column array of source-body columns and insulated gate trench columns, each source-body column further comprises a bottom body region of second conductivity type with a first plurality of finger structures extending upwards there from and, correspondingly, each source-body column further comprises a second plurality of top source regions of first conductivity type bridging the finger structures; and 2. the structure for measurement further comprises:

2a) a source-body column, atop the common drain foundation layer, wherein each top surface of a selected number of finger structures of the bottom body region further comprises a contact electrode formed thereon resulting in a corresponding number of contact electrodes; and 2b) two insulated gate trench columns, each atop the common drain foundation layer, flanking said source-body column and both further comprise a common gate contact electrode formed thereon whereby, upon electrical connection of the contact electrodes and the common gate contact electrode with a corresponding number of external biasing power supplies and voltage/current measurement devices, said body pinch resistance can be measured as the pinch resistance through the bottom body region while mimicking the parasitic effect of neighboring trench MOSFET devices of the high density trench MOSFET array.

11. A method for measuring thus monitoring body pinch resistance of high density trench MOSFET arrays on a semiconductor wafer with a wafer substrate of first conductivity type, each high density trench MOSFET array having a common drain foundation layer of first conductivity type atop the wafer substrate, a two-dimensional (2D) trench MOSFET array atop the common drain foundation layer, the 2D-trench MOSFET array having an interdigitated column array of source-body columns and insulated gate trench columns, each source-body column having a bottom body region of second conductivity type with a first plurality of finger structures extending upwards there from and, correspondingly, each source-body column also having a second plurality of top source regions of first conductivity type bridging the finger structures, the method for measuring body pinch resistance comprises:

1) providing a structure for measurement, co-located on the semiconductor wafer with the high density trench MOSFET arrays, having:

1a) a source-body column, atop the common drain foundation layer, wherein each top surface of a selected number of finger structures of the bottom body region further comprises a contact electrode formed thereon resulting in a corresponding number of contact electrodes; and 1b) two insulated gate trench columns, each atop the common drain foundation layer, flanking said source-body column and both further comprise a common gate contact electrode formed thereon; and 2) electrically connecting the contact electrodes and the common gate contact electrode with a corresponding number of external biasing power supplies and voltage/current measurement devices and measuring said body pinch resistance as the pinch resistance through the bottom body region while mimicking the parasitic effect of neighboring trench MOSFET devices of the high density trench MOSFET arrays.

12. The method for measuring body pinch resistance of claim 11 wherein providing a structure for measurement further comprises forming a contact electrode on each top surface of two selected finger structures and, correspondingly, electrically connecting the contact electrodes and the common gate contact electrode further comprises:

2a) connecting the common gate contact electrode to an external biasing voltage supply; and 2b) connecting the corresponding two contact electrodes to an external 2-terminal resistance measurement means.

13. The method for measuring body pinch resistance of claim 11 wherein providing a structure for measurement further comprises forming a contact electrode on each top surface of four selected finger structures and, correspondingly, electrically connecting the contact electrodes and the common gate contact electrode further comprises:

2a) connecting the common gate contact electrode to an external biasing voltage supply; and 2b) connecting the corresponding four contact electrodes to an external 4-terminal resistance measurement means.

* * * * *